(12) United States Patent
Cheng et al.

(10) Patent No.: US 9,892,946 B1
(45) Date of Patent: Feb. 13, 2018

(54) PROCESSING APPARATUS AND METHOD

(71) Applicant: TAIWAN SEMICONDUCTOR MANUFACTURING CO., LTD., Hsinchu (TW)

(72) Inventors: Kai-Fang Cheng, Taoyuan (TW); Shao-Kuan Lee, Kaohsiung (TW); Hai-Ching Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/220,461

(22) Filed: Jul. 27, 2016

(51) Int. Cl.
H01L 21/67 (2006.01)
H01L 21/677 (2006.01)
H01L 21/683 (2006.01)

(52) U.S. Cl.
CPC .... H01L 21/6719 (2013.01); H01L 21/67017 (2013.01); H01L 21/67115 (2013.01); H01L 21/67126 (2013.01); H01L 21/67196 (2013.01); H01L 21/67745 (2013.01); H01L 21/6838 (2013.01); H01L 21/67103 (2013.01)

(58) Field of Classification Search
CPC ........... H01L 21/6719; H01L 21/67745; H01L 21/6838; H01L 21/67115; H01L 21/67017; H01L 21/67126; H01L 21/67196; H01L 21/67103
USPC .......................................... 118/630; 438/758
See application file for complete search history.

(56) References Cited

U.S. PATENT DOCUMENTS

2006/0011133 A1* 1/2006 Nishibayashi .... H01L 21/67017
118/630
2008/0063809 A1* 3/2008 Lee ..................... H01L 21/3105
427/558

* cited by examiner

Primary Examiner — Caleen Sullivan
(74) Attorney, Agent, or Firm — McClure, Qualey & Rodack, LLP

(57) ABSTRACT

A processing apparatus includes a spin coating chamber, an ultraviolet curing chamber, a transfer module and an enclosure. The transfer module is assigned with a plurality transfer destinations, in which two of the transfer destinations are respectively located within the spin coating chamber and the ultraviolet curing chamber. The transfer module, the spin coating chamber and the ultraviolet curing chamber are enclosed by the enclosure.

20 Claims, 4 Drawing Sheets

PROCESSING APPARATUS AND METHOD

BACKGROUND

The process of forming electronic devices is commonly done in a processing apparatus that has the capability to sequentially process substrates, (e.g., semiconductor wafers) in a controlled processing environment. For example, a spin coating chamber may be included in the processing apparatus to perform a spin coating process to a substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
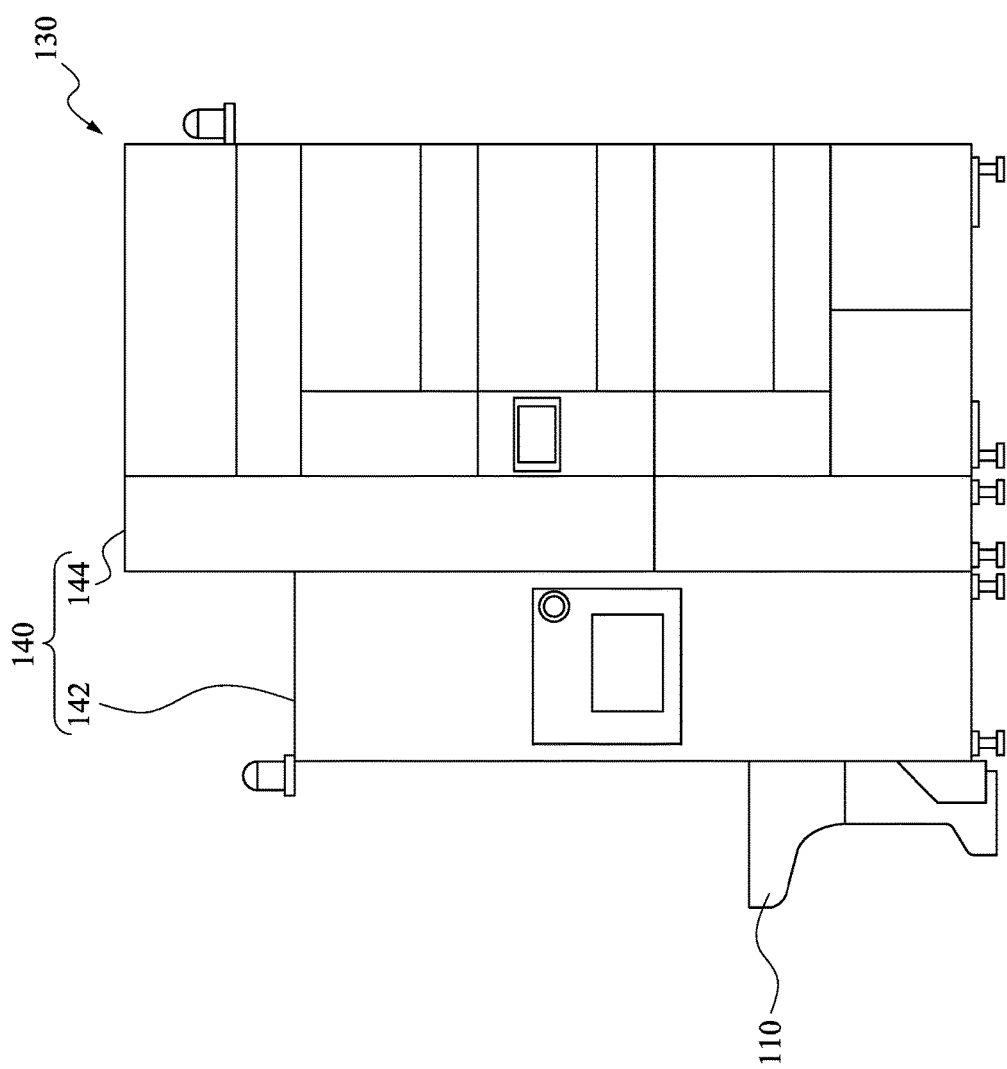
FIG. 1 is a perspective view of a processing apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
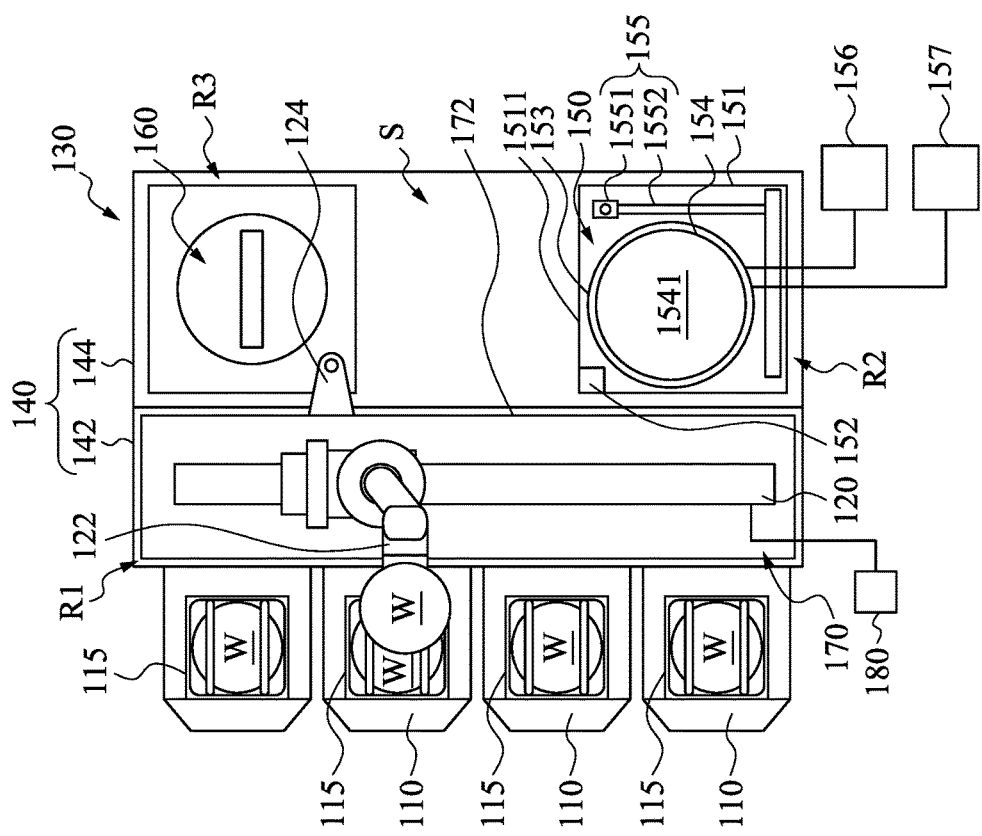
FIG. 2 is a plan view of the processing apparatus shown in FIG. 1.

FIG. 1 is a perspective view of a processing apparatus in accordance with some embodiments of the present disclosure. FIG. 2 is a plan view of the processing apparatus shown in FIG. 1. As shown in FIG. 1 and FIG. 2, the processing apparatus, which may be referred to as a cluster tool as well, includes one or more load ports 110, a transfer module 120, a processing rack 130 and an enclosure 140. The processing rack 130 includes a spin coating chamber 150 and an ultraviolet (UV) curing chamber 160. The one or more load ports 110 can be configured to accept one or more cassettes 115 that may contain one or more substrates W, or wafers, which are to be processed in the processing apparatus. The transfer module 120 is assigned with a plurality of transfer destinations, in which one transfer destination is located within the spin coating chamber 150, and another transfer destination is located within the ultraviolet curing chamber 160. In other words, the transfer module 120 may be a robot assembly having a range of motion sufficient to transfer the substrate W to the spin coating chamber 150 and the ultraviolet curing chamber 160. For example, the transfer module 120 may include a front end robot 122 that is adapted to access the spin coating chamber 150, the ultraviolet curing chamber 160 and the load ports 110. Therefore, the front end robot 122 is capable of transferring the substrate W between the cassette 115 placed on the load port 110 and the spin coating chamber 150, and the front end robot 122 is capable of transferring the substrate W between the cassette 115 placed on the load port 110 and the ultraviolet curing chamber 160 as well. In some embodiments, the transfer module 120 may further include a shuttle robot 124 that is adapted to transfer the substrate W between the spin coating chamber 150 and the ultraviolet curing chamber 160 retained in the processing rack 130. In some other embodiments, the transferring the substrate W can be achieved by the front end robot 122 as well, and in such cases, the shuttle robot 124 may be omitted.

The transfer module 120, the spin coating chamber 150 and the ultraviolet curing chamber 160 are enclosed by the enclosure 140. In other words, the enclosure 1450 has an interior space S, and the transfer module 120, the spin coating chamber 1530 and the ultraviolet curing chamber 160 are located within the interior space S of the enclosure 140. The load port 110 is present between the interior space S and an exterior external to the enclosure 140. In other words, the interior space S and the exterior external to the enclosure 140 can be spatially isolated by the load port 110 when a door (not shown) of the load port 110 is closed. By using such a configuration, transportation of the substrate W between the spin coating chamber 150 and the ultraviolet curing chamber 160 can be confined in the interior space S of the enclosure 140, and contamination to the substrate W during the transportation can be reduced because the transportation can be confined in the interior space S of the enclosure 140. Furthermore, the transportation duration of the substrate W can be reduced as well. Therefore, the processing apparatus can be widely applied to manufacturing processes that include a spin coating process and an ultraviolet curing process. For example, in an exemplary low-k dielectric layer formation process, a solution containing a low-k dielectric material can be formed on the substrate W using the spin coating process that is performed in the spin coating chamber 150. Thereafter, the spin-coated substrate W can be transferred to the ultraviolet curing chamber 160 via the transfer module 120, and the low-k dielectric material on the spin-coated substrate W can be cured using ultraviolet radiation generated in the ultraviolet curing chamber 160. In some embodiments, the spin-coated substrate W can be baked using, for example, a soft bake process, before the curing, so as to benefit to evaporate the solvent of the solution. In an exemplary pore seal layer formation process, a solution containing a pore seal material can be formed on the substrate W using the spin coating process that is performed in the spin coating chamber 150. Thereafter, the spin-coated substrate W can be transferred to the ultraviolet curing chamber 160 via the transfer module 120, and the pore seal material on the spin-coated substrate W can be cured using ultraviolet radiation generated in the ultraviolet curing chamber 160. In some embodiments, the spin-coated substrate W can be baked using, for example, a soft bake process, before the curing, so as to benefit to evaporate the solvent of the solution. Moreover, a substrate having a metal hard mask (MHM) thereon may undergo ultraviolet radiation generated in the ultraviolet curing chamber 160, and such an ultraviolet treatment to the metal hard mask can improve an etching selectivity of the metal hard mask.

In some embodiments, the enclosure 140 includes a transfer enclosure 142 that is adapted to control the environment around the transfer module 120 and between the load ports 110 and the processing rack 130. In some embodiments, the transfer module 120 can be enclosed in the transfer enclosure 142. In some embodiments, the enclosure 140 includes a processing rack enclosure 144. The processing rack enclosure 144 is adapted to control the environment around the spin coating chamber 150 and the ultraviolet curing chamber 160. In some embodiments, the spin coating chamber 150 and the ultraviolet curing chamber 160 can be enclosed in the processing rack enclosure 144. In some embodiments, an interior space of the transfer enclosure 142 and that of the processing rack enclosure 144 are communicated, and they can cooperatively serve as the interior space S of the enclosure 140.

In some embodiments, the spin coating chamber 150 includes a gas flow distribution system 152, a cup 153, a spin chuck 154 and a fluid dispense system 155. There is a chamber enclosure 151 within which the gas flow distribution system 152, the cup 153, a spin chuck 154 and a fluid dispense system 155 are enclosed. The chamber enclosure 151 may include a plurality of walls, and one of the walls may be the wall 1511 that is interposed between the spin coating chamber 150 and the ultraviolet curing chamber 160. In some embodiments, the wall 1511 between the spin coating chamber 150 and the ultraviolet curing chamber 160 may be made of a material that is able to block ultraviolet radiation, so that it can serve as an ultraviolet blocking structure which can block the ultraviolet radiation generated in the ultraviolet curing chamber 160 from irradiating the spin coating chamber 150. For example, the wall 1511 may be made of a plastic material opaque to ultraviolet radiation, such as, for example, polytetrafluoroethylene (PTFE), polyvinylidene fluoride (PVDF), fluorinated ethylene propylene (FEP) or polyether ether ketone (PEEK). As such, influence on the substrate W retained in the spin coating chamber 150 caused by the ultraviolet radiation can be reduced. In some embodiments, the wall 1511 between the spin coating chamber 150 and the ultraviolet curing chamber 160 may be made of a material that is able to isolate fluid, so that it can serve as a fluid isolating structure which can isolate the ultraviolet curing chamber 160 from the fluid or liquid used in the spin coating chamber 150. In some embodiments, the wall 1511 between the spin coating chamber 150 and the ultraviolet curing chamber 160 may be made of an UV-opaque and waterproof plastic material, such as, for example, polytetrafluoroethylene (PTFE), polyvinylidene fluoride (PVDF), fluorinated ethylene propylene (FEP) or polyether ether ketone (PEEK).

The cup 153 surrounds the spin chuck 154. The spin chuck 154 may be attached to a rotation motor 156 through a rotation shaft (not shown), so that the rotation motor 156 can actuate the spin chuck 154 to spin. The spin chuck 154 may include a sealing surface 1541 that is adapted to hold the substrate W when the substrate W is being rotated. The substrate W may be held to the sealing surface 1541 by use of a vacuum generated by a vacuum source 157. The cup 153 may be made of a material, such as, a plastic material (e.g., polytetrafluoroethylene (PTFE), perfluoroalkoxy (PFA), polypropylene, polyvinylidene fluoride (PVDF), etc), a ceramic material, a metal coated with a plastic material (e.g., aluminum coated with either PVDF), or other materials that is compatible with the processing fluid delivered from the fluid dispense system 155. The spin chuck 154 may be coupled to a lift assembly (not shown), which may include an actuator, such as an air cylinder or servomotor, and a guide, such as a linear ball bearing slide, which are adapted to raise and lower the rotatable spin chuck 154 to a predetermined position. The lift assembly is thus adapted to position the substrate W held on the rotatable spin chuck 154 in the cup 153 during the spin coating process and also to lift the substrate W to above a top of the cup 153 to exchange the substrate W with an external robot (e.g., the front end robot 122 or the shuttle robot 124) positioned outside the chamber enclosure 151. A robot blade or an end effector of the external robot can enter the chamber enclosure 151 through an access port formed in a wall of the chamber enclosure 151.

In some embodiments, the chamber enclosure 151 placed around the spin chuck 154 can control the environment around the surface of the substrate W to improve the thickness uniformity control for larger substrate sizes. The improved uniformity control is due to the control of the vaporization of the solvent, since the chamber enclosure 151 placed around the substrate W tends to prevent of gas flow across the surface of the substrate W, and thus allows the coated material to spread out before an appreciable amount of solvent has evaporated from the coated material. In some other embodiments, thickness uniformity control in the spin-on type coating process may also rely on the control of the rotation speed of the spin chuck 154 and exhaust flow rate to control the vaporization of the uniformity of the final coated layer.

The gas flow distribution system 152 is adapted to deliver a substantially uniform flow of a gas through the chamber enclosure 151 and cup 153 to an exhaust system (not shown). In some embodiments, the gas flow distribution system 152 may be a HEPA filter assembly which may include a HEPA filter and a filter enclosure (not shown). The HEPA filter and filter enclosure can form a plenum that allows the gas entering from the gas source to substantially uniformly flow through the HEPA filter, the chamber enclosure 151, the cup 153 and the spin chuck 154. In some embodiments, the gas source is adapted to deliver a gas (e.g., air) at a predetermined temperature and humidity to the spin chuck 154, so as to control the environment in the chamber enclosure 151.

The fluid dispense system 155 may include one or more fluid source assemblies which deliver a solution containing the coating material to the surface of the substrate W held by the spin chuck 154. The fluid source assembly may exemplarily include a discharge nozzle 1551 and a dispense arm 1552. The discharge nozzle 1551 and the dispense arm 1552 can be moved to a predetermined position so that a processing fluid or solution can be dispensed from the discharge nozzle 1551 onto a predetermined position on the surface of the substrate W. For example, the dispense arm 1552 may be movable and/or rotatable by actuation of an actuator (not shown), and the discharge nozzle 1551 is located on the dispense arm 1552, so that the discharge nozzle 1551 can be moved to a predetermined position above the sealing surface 1541 of the spin chuck 154 by movement and/or rotation of the dispense arm 1552. The processing fluid may be delivered to the discharge nozzle 1551 by use of a pump (not shown). For example, the pump can remove a processing fluid from a fluid source (not shown) and discharges the processing fluid through the discharge nozzle 1551 and onto the surface of the substrate W. The processing solution discharged from the discharge nozzle 1551 may be dispensed onto the substrate W when it is rotated by the spin chuck 154. In some embodiments, a suck back valve (not shown) may be adapted to draw back an amount of solution from the discharge nozzle 1551 after predetermined amount of processing fluid is dispensed on the substrate W to prevent dripping of unwanted material on the surface of the substrate W held on the spin chuck 154. The dispensed processing solution is spun off the edge of the substrate W, collected by inner walls of the cup 153 and diverted to a drain and ultimately a waste collection system (not shown).

In some embodiments, to assure a uniform and repeatable coating process, the temperature during the spin coating process may be accurately controlled since the properties and process results may be affected by the temperature. The optimum dispense temperature may vary from one material to another. Therefore, the spin coating chamber 150 may include multiple fluid dispense systems 155 to run different process recipes containing different materials, the temperature of different fluid dispense systems 155 may be independently and individually controlled to benefit predetermined process results can be achieved.

In some embodiments, the processing apparatus further includes a transfer chamber 170. At least a portion of the transfer module 120 is located within the transfer chamber 170. The transfer chamber 170 is enclosed in the enclosure 140. In some embodiments, the enclosure 140 includes a plurality of spatially separated internal regions R1, R2 and R3 within the interior space S. The internal regions R1, R2 and R3 are respectively occupied by the transfer chamber 170, the spin coating chamber 150 and the ultraviolet curing chamber 160. In other words, transportation of the substrate W can be confined in the interior space S of the enclosure 140, and contamination to the substrate W during the transportation can be reduced because the transportation can be confined in the interior space S of the enclosure 140. Furthermore, the transportation duration of the substrate W can be reduced as well. The transfer chamber 170 is capable of being communicated with the spin coating chamber 150 and the ultraviolet curing chamber 160, so that at least one of the front end robot 122 and the shuttle robot 124 can move into the spin coating chamber 150 and the ultraviolet curing chamber 160 for allowing the transportation of the substrate W. In some embodiments, there is a wall 172 interposed between the transfer chamber 170 and the ultraviolet curing chamber 160. In some embodiments, the wall 172 between the transfer chamber 170 and the ultraviolet curing chamber 160 may be made of a material that is able to block ultraviolet radiation, so that it can serve as an ultraviolet blocking structure which can block the ultraviolet radiation generated in the ultraviolet curing chamber 160 from irradiating the transfer chamber 170. For example, the wall 172 may be made of a plastic material opaque to ultraviolet radiation, such as, for example, polytetrafluoroethylene (PTFE), polyvinylidene fluoride (PVDF), Fluorinated ethylene propylene (FEP) or Polyether ether ketone (PEEK). As such, influence on the substrate W retained in the transfer chamber 170 caused by the ultraviolet radiation can be reduced.

Figure 3:
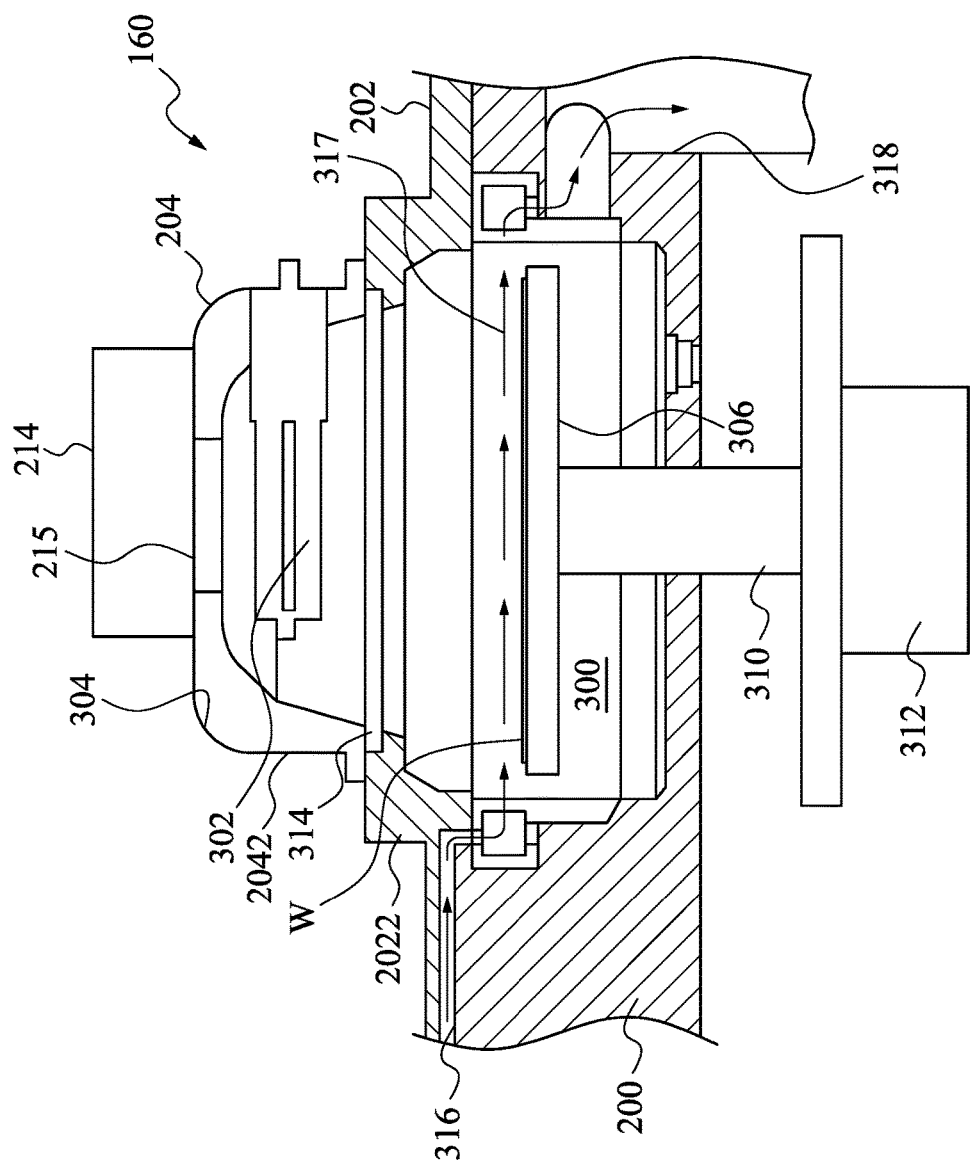
FIG. 3 is a fragmentary cross-sectional view of an exemplary ultraviolet curing chamber in accordance with some embodiments of the present disclosure.

FIG. 3 is a fragmentary cross-sectional view of an exemplary ultraviolet curing chamber 160 in accordance with some embodiments of the present disclosure. In some embodiments, the ultraviolet curing chamber 160 may include a body 200 and a lid 202 that can be hinged to the body 200. A housing 204 may be coupled to the lid 202. The housing 204 covers an ultraviolet lamp bulb 302 disposed above a process region 300 defined within the body 200. The body 200 may include a door (not shown) that can be opened for exchanging the substrate W within the process region 300 with an external robot (e.g., the front end robot 122 or the shuttle robot 124) positioned outside the body 200. The process region 300 includes a heating pedestal 306 for supporting a substrate W within the process region 300. The heating pedestal 306 may be made of ceramic or metal such as aluminum. In some embodiments, the heating pedestal 306 can be heated to between about 150° C. to about 400° C. for benefiting the curing process. In some embodiments, the pedestal 306 couples to a stem 310 that extends through a bottom of the body 200 and are operated by a drive system 312 to move the heating pedestal 306 in the processing region 300 toward or away from the UV lamp bulb 302. The drive system 312 can also rotate and/or translate the pedestal 306 during curing to further enhance uniformity of substrate illumination. Adjustable positioning of the pedestal 306 enables control of volatile cure by-product and purge and clean gas flow patterns and residence times in addition to potential fine tuning of incident UV irradiance levels on the substrate W depending on the nature of the light delivery system design considerations, such as focal length.

In some embodiments, the housing 204 includes at least one wall 2042, and the lid 202 comprises at least one wall 2022. At least one of the walls 2022 and 2042 is present between the ultraviolet curing chamber 160 and the spin coating chamber 150 (See FIG. 2). In some embodiments, at least one of the walls 2022 and 2042 between the spin coating chamber 150 and the ultraviolet curing chamber 160 may be made of a material that is able to block ultraviolet radiation, so that it can serve as an ultraviolet blocking structure which can block the ultraviolet radiation from irradiating to the spin coating chamber 150. For example, at least one of the walls 2022 and 2042 may be made of a plastic material opaque to ultraviolet radiation, such as, for example, polytetrafluoroethylene (PTFE), polyvinylidene fluoride (PVDF), fluorinated ethylene propylene (FEP) or polyether ether ketone (PEEK). As such, influence on the substrate W retained in the spin coating chamber 150 caused by the ultraviolet radiation can be reduced.

In some embodiments, a UV source, such as a mercury microwave arc lamp, a pulsed xenon flash lamp or a high-efficiency UV light emitting diode array, can be employed. In some embodiments, a suitable UV source may be the Fusion® bulb having output maxima at 260-270 nm, 320 nm and 360 nm ("H" bulb), at 215-315 nm, and 365 nm ("H+" bulb), at 350-390 nm ("D" bulb) or at 400-430 nm ("V" bulb). Combinations of these Fusion® bulbs lamps may also be used. In some embodiments, the UV lamp bulb 302 may be sealed plasma bulb filled with one or more gases such as helium (He), argon (Ar), nitrogen ($N_2$), xenon (Xe), or mercury (Hg) for excitation by a power source 214. In some embodiments, the power source 214 may be a microwave generator that can include one or more magnetrons (not shown) and one or more transformers (not shown) to energize filaments of the magnetrons. In some embodiments having the kilowatt microwave (MW) power source, the housing 204 includes an aperture 215 adjacent the power source 214 to receive up to a predetermined microwave power from the power source 214 to subsequently generate up to a predetermined power of UV light from the UV lamp bulb 302. In some other embodiments, the UV lamp bulb 302 can include an electrode or filament therein such that the power source 214 represents circuitry and/or current supplies, such as direct current (DC) or pulsed DC, to the electrode.

In some embodiments, the power source 214 may include a radio frequency (RF) energy source that is capable of excitation of the gases within the UV lamp bulb 302. The configuration of the RF excitation in the bulb can be capacitive or inductive. An inductively coupled plasma (ICP) bulb can be used to efficiently increase bulb brilliancy by generation of denser plasma than with the capacitively coupled discharge. In addition, the ICP lamp eliminates degradation in UV output due to electrode degradation resulting in a longer-life bulb for enhanced system productivity. Benefits of the power source 214 being the RF energy source include an increase in efficiency.

In some embodiments, the UV lamp bulb 302 can emit light across a broad band of wavelengths from 170 nm to 400 nm. The gases selected for use within the UV lamp bulb 302 can determine the wavelengths emitted. Since shorter wavelengths tend to generate ozone when oxygen is present, UV light emitted by the UV lamp bulb 302 can be tuned to predominantly generate broadband UV light above 200 nm to avoid ozone generation during the UV cure process.

UV light emitted from the UV lamp bulb 302 enters the processing region 300 by passing through window 314 located in the aperture in the lid 202. The window 314 may be made of an OH free synthetic quartz glass and has sufficient thickness to maintain vacuum without cracking. Further, the window 314 may be fused silica that transmits UV light down to approximately 150 nm. Since the lid 202 is sealed to the body 200 and the window 314 is sealed to the lid 202, the processing region 300 provide volumes capable of maintaining pressures from approximately 0.1 Torr to approximately 10 Torr for benefiting the curing process. Processing or cleaning gases 317 enter the process region 300 via an inlet passage 316. The processing or cleaning gases 317 then exit the process region 300 via an outlet port 318. Moreover, cooling air can be supplied to the interior of the housing 204 to circulate past the UV lamp bulb 302, and the cooling air may be isolated from the process region 300 by the window 314.

In some embodiments, the housing 204 includes an interior parabolic surface defined by a cast quartz lining 304 coated with a dichroic film. The quartz lining 304 reflects UV light emitted from the UV lamp bulb 302 and is shaped to suit the cure process as well as the chamber clean process based on the pattern of UV light directed by the quartz lining 304 into the process region 300. In some embodiments, the quartz lining 304 adjusts to better suit the cure process as well as the chamber clean process by moving and changing the shape of the interior parabolic surface. In some embodiments, the quartz lining 304 may transmit infrared light and reflect ultraviolet light emitted by the UV lamp bulb 302 due to the dichroic film. The dichroic film may constitute a periodic multilayer film composed of diverse dielectric materials having alternating high and low refractive index. Since the dichroic film is non-metallic, microwave radiation from the power source 214 that is downwardly incident on the backside of the cast quartz lining 304 does not significantly interact with, or get absorbed by, the dichroic film and is readily transmitted for ionizing the gas in the UV lamp bulb 302.

In some embodiments, rotating or otherwise periodically translating the quartz lining 304 during curing and/or cleaning enhances the uniformity of illumination in the substrate plane. In some other embodiments, the housing 204 rotates or translates periodically over the substrate W on the pedestal 306 when the quartz lining 304 is stationary with respect to the UV lamp bulb 302. In still some other embodiments, rotation or periodic translation of the substrate W via the pedestal 306 provides the relative motion between the substrate W and the UV lamp bulb 302 to enhance illumination and curing uniformity.

Reference can be made back to FIG. 2. In some embodiments, the processing apparatus may include a controller 180. The controller 180 is configured to or programmable to assign transfer destinations to the transfer module 120 and to control the transfer module 120 to move to the transfer destinations located within spin coating chamber 150 and the ultraviolet curing chamber 160 in sequence. Therefore, a substrate W can be spin-coated in the spin coating chamber 150 in advance. Thereafter, the spin-coated substrate W can be transferred to the ultraviolet curing chamber 160 and be cured using ultraviolet radiation generated in the ultraviolet curing chamber 160. Since ultraviolet blocking features or structures are presented between the ultraviolet curing chamber 160 and the spin coating chamber 150 and between the ultraviolet curing chamber 160 and the transfer chamber 170 respectively, the ultraviolet radiation generated in the ultraviolet curing chamber 160 may be blocked from the spin coating chamber 150 and the transfer chamber 170, so as to reduce influence on the substrates W located in the spin coating chamber 150 and the transfer chamber 170 caused by the ultraviolet radiation.

In some embodiments, the controller 180 may be a microprocessor-based controller, and such a controller 180 can be adapted to receive inputs from a user and/or various sensors in at least one of the processing chambers (e.g., the spin coating chamber 150 and the ultraviolet curing chamber 160) and appropriately control the processing chamber components in accordance with the various inputs and software instructions retained in the controller's memory. The controller 180 may include memory and a CPU (not shown) which are utilized by the controller 180 to retain various programs, process the programs, and execute the programs. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. Support circuits (not shown) are also connected to the CPU for supporting the processor. The support circuits may include cache, power supplies, clock circuits, input/output circuitry, subsystems, or the like. A program (or computer instructions) readable by the controller 180 determines which process or task is performable in the processing chamber(s). In some embodiments, the program is software readable by the controller 180 and includes instructions to monitor and control the process based on defined rules and input data.

Figure 4:
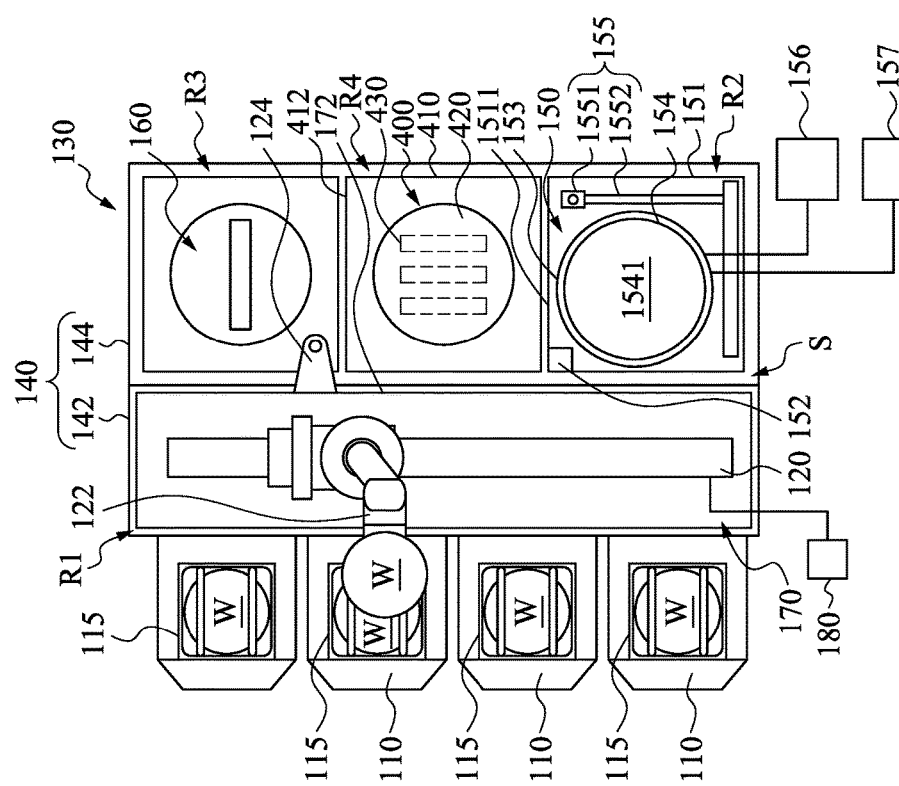
FIG. 4 is a plan view of a processing apparatus in accordance with some embodiments of the present disclosure.

FIG. 4 is a plan view of a processing apparatus in accordance with some embodiments of the present disclosure. As shown in FIG. 4, the processing apparatus further includes a baking chamber 400. One of the transfer destinations of the transfer module 120 is located within the baking chamber 400. In other words, the range of motion is sufficient to transfer the substrate W to the baking chamber 400. The baking chamber 400 is enclosed in the enclosure 140. In some embodiments, the enclosure 140 includes a plurality of spatially separated internal regions R1, R2, R3 and R4 within the interior space S. The internal regions R1, R2, R3 and R4 are respectively occupied by the transfer chamber 170, the spin coating chamber 150, the ultraviolet curing chamber 160 and the baking chamber 400. In other words, transportation of the substrate W can be confined in the interior space S of the enclosure 140, and contamination to the substrate W during the transportation can be reduced because the transportation can be confined in the interior space S of the enclosure 140. Furthermore, the transportation duration of the substrate W can be reduced as well.

In some embodiments, the baking chamber 400 may exemplarily include a baking plate 420 and a heat exchanging device 430. There is a baking enclosure 410 within which the baking plate 420 and the heat exchanging device 430 are enclosed. The baking enclosure 410 may include a plurality of walls, and one of the walls may be the wall 412 that is interposed between the baking chamber 400 and the ultraviolet curing chamber 160. In some embodiments, the wall 412 between the baking chamber 400 and the ultraviolet curing chamber 160 may be made of a material that is able to block ultraviolet radiation, so that it can serve as an ultraviolet blocking structure which can block the ultraviolet radiation generated in the ultraviolet curing chamber 160 from irradiating the baking chamber 400. For example, the wall 412 may be made of a plastic material opaque to ultraviolet radiation, such as, for example, polytetrafluoroethylene (PTFE), polyvinylidene fluoride (PVDF), fluorinated ethylene propylene (FEP) or folyether ether ketone (PEEK). As such, influence on the substrate W retained in the baking chamber 400 caused by the ultraviolet radiation can be reduced. In some embodiments, the wall 412 between the baking chamber 400 and the ultraviolet curing chamber 160 may be made of a high thermal resistance material, so that it can serve as a thermal insulation structure which can reduce heat transfer between the baking chamber 400 and the ultraviolet curing chamber 160. In some embodiments, the wall 412 between the baking chamber 400 and the ultraviolet curing chamber 160 may be made of an UV-opaque and high thermal resistance plastic material, such as, for example, polytetrafluoroethylene (PTFE), polyvinylidene fluoride (PVDF), fluorinated ethylene propylene (FEP) or polyether ether ketone (PEEK).

The baking plate 420 is a thermally conductive plate that can be heated by the heat exchanging device 430 to perform the various bake processes, such as, for example, a soft bake process. The baking plate 420 is thermally conductive to improve temperature uniformity during processing. In some embodiments, the baking plate 420 may be made of aluminum, graphite, aluminum-nitride, or other thermally conductive material. In some embodiments, an upper surface of the baking plate 420 which is in contact with the substrate W may coated with a Teflon impregnated anodized aluminum, silicon carbide or other material that can minimize particle generation on the backside of the substrate W as it comes in contact with the baking plate 420. In some embodiments, the substrate W rests on pins (not shown) embedded in the upper surface of the baking plate 420 so that a small gap can be maintained between the substrate W and the baking plate 420 to reduce particle generation. In some embodiments, the heat exchanging device 430 is a thermoelectric device that is adapted to heat the baking plate 420. In some embodiments, the heat exchanging device 430 includes a plurality of channels (not shown) formed in a lower surface of the baking plate 420, which are temperature controlled by use of a heat exchanging fluid that continually flows through the channels. A fluid temperature controller (not shown) is adapted to control the heat exchanging fluid and thus control temperature of the baking plate 420. The heat exchanging fluid may be, for example, a perfluoropolyether (e.g., Galden®) that is temperature controlled to a temperature between about 30° C. and about 250° C. The heat exchanging fluid may also be a temperature controlled gas, such as argon or nitrogen. In some embodiments, the baking plate 420 may rest on a plate that is made of a thermally insulating material, such as a ceramic material (e.g., zirconia, alumina, etc.), to reduce unwanted heat loss.

In some embodiments, a lift assembly (not shown) may adapted to raise and lower the substrate W off an external robot (e.g. the front end robot 122 or the shuttle robot 124) and place the substrate W on the upper surface of the baking plate 420 once the external robot has been retracted. The lift assembly can be actuated by an actuator that may be an air cylinder or other available means of raising and lowering the substrate W. The external robot is adapted to enter the baking chamber 400 through an access port formed in a wall of the baking enclosure 410.

In some embodiments, the controller 180 is configured to or programmable to control the transfer module 120 to move to the transfer destinations located within spin coating chamber 150, the baking chamber 400 and the ultraviolet curing chamber 160 in sequence. Therefore, a substrate W can be spin-coated in the spin coating chamber 150 in advance. Thereafter, the spin-coated substrate W can be transferred to the baking chamber 400 and be soft baked. Afterwards, the soft baked substrate W can be transferred to the ultraviolet curing chamber 160 and be cured using the ultraviolet radiation generated in the ultraviolet curing chamber 160. Since ultraviolet blocking features or structures are presented between the ultraviolet curing chamber 160 and the spin coating chamber 150, between the ultraviolet curing chamber 160 and the baking chamber 400 and between the ultraviolet curing chamber 160 and the transfer chamber 170 respectively, the ultraviolet radiation generated in the ultraviolet curing chamber 160 may be blocked from the spin coating chamber 150, the baking chamber 400 and the transfer chamber 170, so as to reduce influence on the substrates W located in the spin coating chamber 150, the baking chamber 400 and the transfer chamber 170 caused by the ultraviolet radiation.

Figure 5:
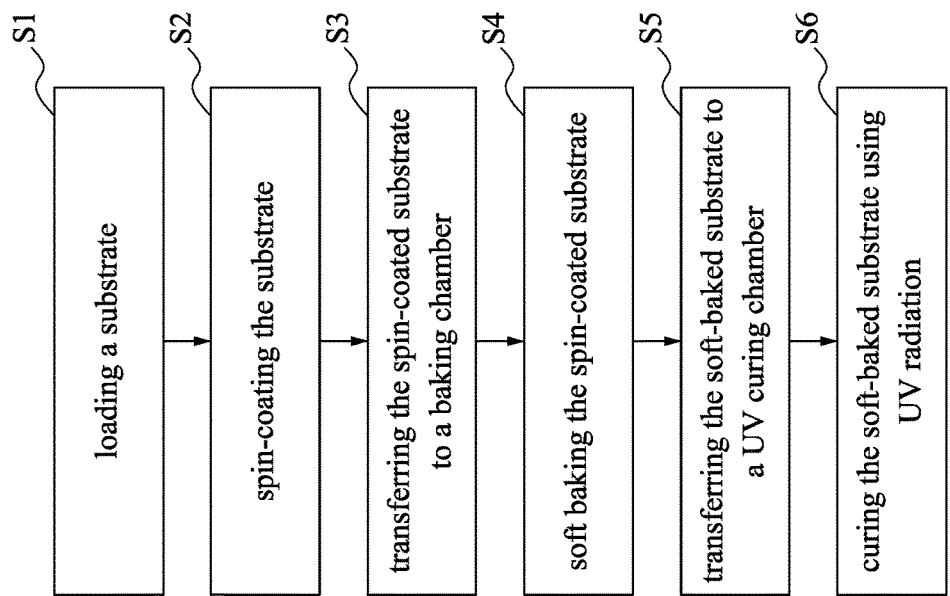
FIG. 5 is a flow chart illustrating a processing method in accordance with some embodiments of the present disclosure.

FIG. 5 is a flow chart illustrating a processing method in accordance with some embodiments of the present disclosure. In step S1, a substrate W is loaded into the spin coating chamber 150 within the enclosure 140 from the load port 110 via the transfer module 120. For example, the front end robot 122 of the transfer module 120 can extract the substrate W in the cassette 115 placed on the load port 110 and can transport the substrate W into the enclosure 140.

In step S2, the substrate W is spin-coated using devices in the spin coating chamber 150. For example, the substrate W can be held by the spin chuck 154, the spin chuck 154 spins, and the fluid dispense system 155 can dispense fluid or solution onto the substrate W held by the spin chuck 154.

In step S3, the spin-coated substrate W can be transferred to the baking chamber 400 via the transfer module 120. For example, the front end robot 122 or the shuttle robot 124 of the transfer module 120 can extract the spin-coated substrate W in the spin coating chamber 150 and can transport the spin-coated substrate W to the baking chamber 400. In some embodiments, during the transferring the spin-coated substrate W, the enclosure 140 is kept closed to prevent contamination to the spin-coated substrate W. For example, the door (not shown) of the load port 110 is kept closed.

In step S4, the spin-coated substrate W can be soft-baked using devices in the baking chamber 400. For example, the spin-coated substrate W can be placed on the baking plate 420, and the heat exchanging device 430 may heat the baking plate 420 to a predetermined temperature to perform the soft bake process.

In step S5, the soft-baked substrate W can be transferred to the ultraviolet curing chamber 160 via the transfer module 120. For example, the front end robot 122 or the shuttle robot 124 of the transfer module 120 can extract the soft-baked substrate W in the baking chamber 400 and can transport the soft-baked substrate W to the ultraviolet curing chamber 160. In some embodiments, during the transferring the soft-baked substrate W, the enclosure 140 is kept closed to prevent contamination to the soft-baked substrate W. For example, the door (not shown) of the load port 110 is kept closed.

In step S6, the soft-baked substrate W can be cured using ultraviolet radiation generated in the ultraviolet curing chamber 160. For example, the soft-baked substrate W can be placed on the pedestal 306 in the ultraviolet curing chamber 160, and the ultraviolet lamp bulb 302 in the ultraviolet curing chamber 160 may be excited to generate ultraviolet radiation to irradiate the soft-baked substrate W, so that the soft-baked substrate W can be cured by the ultraviolet radiation.

In some embodiments, since the spin coating chamber and the ultraviolet curing chamber are enclosed in an enclosure, contamination to the substrate during the transportation of the substrate can be reduced because the transportation can be confined in the enclosure. In other words, since the spin coating chamber and the ultraviolet curing chamber are located within the interior space of the enclosure, the contamination to the substrate during the transportation of the substrate can be reduced.

According to some embodiments, a processing apparatus includes a spin coating chamber, an ultraviolet curing chamber, a transfer module and an enclosure. The transfer module is assigned with a plurality transfer destinations, in which two of the transfer destinations are respectively located within the spin coating chamber and the ultraviolet curing chamber. The transfer module, the spin coating chamber and the ultraviolet curing chamber are enclosed by the enclosure.

According to some embodiments, a processing apparatus includes a spin coating chamber, an ultraviolet curing chamber, a robot assembly and an enclosure. The robot assembly has a range of motion sufficient to transfer a substrate to the spin coating chamber and the ultraviolet curing chamber. The enclosure has an interior space within which the spin coating chamber, the ultraviolet curing chamber and the robot assembly are located.

According to some embodiments, a processing method includes loading a substrate into an enclosure, spin-coating the substrate in a chamber within the enclosure, transferring the spin-coated substrate to another chamber within the enclosure, and curing the transferred substrate using ultraviolet radiation generated in the another chamber within the enclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A processing apparatus, comprising:
    a spin coating chamber;
    an ultraviolet curing chamber;
    a transfer module assigned with a plurality transfer destinations, wherein two of the transfer destinations are respectively located within the spin coating chamber and the ultraviolet curing chamber, the transfer module comprising a robot movable from the spin coating chamber to the ultraviolet curing chamber;
    an enclosure enclosing the transfer module, the spin coating chamber and the ultraviolet curing chamber; and
    a load port closer to the robot than to the ultraviolet curing chamber.

2. The processing apparatus of claim 1, further comprising:
    an ultraviolet blocking structure present between the spin coating chamber and the ultraviolet curing chamber.

3. The processing apparatus of claim 1, further comprising:
    a fluid isolating structure present between the spin coating chamber and the ultraviolet curing chamber.

4. The processing apparatus of claim 1, wherein the enclosure comprises a plurality of spatially separated internal regions that are respectively occupied by the spin coating chamber and the ultraviolet curing chamber.

5. The processing apparatus of claim 1, further comprising:
    a baking chamber within which another of the transfer destinations assigned to the transfer module is located, the baking chamber being enclosed by the enclosure.

6. The processing apparatus of claim 5, further comprising:
    a controller configured to control the transfer module to move to the transfer destinations located within the spin coating chamber, the baking chamber, and the ultraviolet curing chamber in sequence.

7. The processing apparatus of claim 5, wherein the enclosure comprises a plurality of spatially separated internal regions that are respectively occupied by the baking chamber, the spin coating chamber and the ultraviolet curing chamber.

8. The processing apparatus of claim 5, further comprising:
    a thermal insulation structure present between the ultraviolet curing chamber and the baking chamber.

9. The processing apparatus of claim 5, further comprising:
    an ultraviolet blocking structure present between the ultraviolet curing chamber and the baking chamber.

10. The processing apparatus of claim 1, further comprising:
    a transfer chamber within which at least a portion of the transfer module is located, wherein the transfer chamber is capable of being communicated with the spin coating chamber and the ultraviolet curing chamber.

11. The processing apparatus of claim 10, further comprising:
    an ultraviolet blocking structure present between the transfer chamber and the ultraviolet curing chamber.

12. The processing apparatus of claim 10, wherein the enclosure comprises a plurality of spatially separated internal regions that are respectively occupied by the transfer chamber, the spin coating chamber and the ultraviolet curing chamber.

13. A processing apparatus, comprising:
a spin coating chamber;
an ultraviolet curing chamber;
a robot assembly having a range of motion sufficient to transfer a substrate to the spin coating chamber and the ultraviolet curing chamber;
at least one enclosure having an interior space within which the spin coating chamber, the ultraviolet curing chamber and the robot assembly are located; and
a baking chamber between the spin coating chamber and the ultraviolet curing chamber.

14. The processing apparatus of claim 13, further comprising:
an ultraviolet blocking wall interposed between the spin coating chamber and the ultraviolet curing chamber.

15. The processing apparatus of claim 13,
wherein the robot assembly has the range of motion sufficient to transfer the substrate to the baking chamber; and
an ultraviolet blocking wall interposed between the baking chamber and the ultraviolet curing chamber.

16. The processing apparatus of claim 13, further comprising:
a transfer chamber within which at least a portion of the robot assembly is located; and
an ultraviolet blocking wall interposed between the transfer chamber and the ultraviolet curing chamber.

17. The processing apparatus of claim 13, further comprising:
at least one load port present between the interior space and an exterior external to the enclosure.

18. A processing apparatus, comprising:
an enclosure having an interior space;
a spin coating chamber in the interior space of the enclosure, the spin coating chamber having a wall opaque to ultraviolet radiation;
an ultraviolet curing chamber in the interior space of the enclosure;
a robot having a range of motion sufficient to transfer a substrate from the spin coating chamber to the ultraviolet curing chamber; and
a load port capable of spatially isolating the interior space of the enclosure and an exterior external to the enclosure.

19. The processing apparatus of claim 18, further comprising:
a baking chamber in the interior space of the enclosure, wherein a wall of the baking chamber is opaque to ultraviolet radiation.

20. The processing apparatus of claim 18, wherein the load port is closer to the robot than to the ultraviolet curing chamber.

* * * * *